United States Patent
Lee

(10) Patent No.: US 10,121,525 B2
(45) Date of Patent: Nov. 6, 2018

(54) NONVOLATILE MEMORY DEVICE AND OPERATING METHOD OF THE SAME

(71) Applicant: SAMSUNG ELECTRONICS CO., LTD., Suwon-si, Gyeonggi-do (KR)

(72) Inventor: Yong Jun Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/793,497

(22) Filed: Oct. 25, 2017

(65) Prior Publication Data

US 2018/0197593 A1  Jul. 12, 2018

(30) Foreign Application Priority Data

Jan. 10, 2017 (KR) .................. 10-2017-0003448

(51) Int. Cl.

| | | |
|---|---|---|
| G11C 7/00 | (2006.01) | |
| G11C 11/16 | (2006.01) | |
| G11C 7/22 | (2006.01) | |
| G11C 7/12 | (2006.01) | |
| G11C 7/10 | (2006.01) | |
| G11C 11/56 | (2006.01) | |
| G11C 13/00 | (2006.01) | |

(52) U.S. Cl.
CPC ........ G11C 11/1675 (2013.01); G11C 7/1072 (2013.01); G11C 7/1078 (2013.01); G11C 7/1096 (2013.01); G11C 7/12 (2013.01); G11C 7/222 (2013.01); G11C 11/5678 (2013.01); G11C 13/0023 (2013.01); G11C 13/0028 (2013.01); G11C 13/0069 (2013.01)

(58) Field of Classification Search
CPC .............. G11C 13/0028; G11C 13/004; G11C 13/0069; G11C 2013/0078
See application file for complete search history.

(56) References Cited

U.S. PATENT DOCUMENTS

| | | | |
|---|---|---|---|
| 5,959,929 A | 9/1999 | Cowles et al. | |
| 7,349,245 B2 * | 3/2008 | Kim .................. | G11C 13/0004 365/158 |
| 7,643,334 B1 * | 1/2010 | Lee .......................... | G11C 7/22 365/163 |

(Continued)

FOREIGN PATENT DOCUMENTS

| | | |
|---|---|---|
| JP | 2011119027 | 8/2011 |
| KR | 1020060089074 | 10/2008 |
| KR | 101037487 | 5/2011 |

*Primary Examiner* — Tuan T Nguyen

(74) *Attorney, Agent, or Firm* — F. Chau & Associates, LLC

(57) ABSTRACT

A nonvolatile memory device includes memory banks and write block circuits. Each of the memory banks includes an array of memory cells. Each of the memory cells is disposed in a region of the memory banks in which bit lines and word lines intersect. The write block circuits are connected to the memory banks. Each of the write block circuits includes write drivers, that are each connected to the bit lines. The write block circuits provide a write current of the memory cells to the bit lines. A total number of write block circuits is used to determine the number of memory banks that are simultaneously provided with a write command from a host. A total number of write drivers that are activated is based on a predetermined reference value.

20 Claims, 10 Drawing Sheets

(56) References Cited

U.S. PATENT DOCUMENTS

| | | | |
|---|---|---|---|
| 7,804,725 B2 | 9/2010 | Lee et al. | |
| 7,889,544 B2* | 2/2011 | Chow | G06F 12/0804 |
| | | | 365/148 |
| 7,936,594 B2 | 5/2011 | Park et al. | |
| 8,050,084 B2* | 11/2011 | Bae | G11C 7/04 |
| | | | 365/163 |
| 8,120,973 B2 | 2/2012 | Park et al. | |
| 8,379,473 B2 | 2/2013 | Kim et al. | |
| 8,531,684 B2 | 9/2013 | Min et al. | |
| 9,659,644 B2* | 5/2017 | Jeong | G11C 13/0069 |
| 2004/0042292 A1* | 3/2004 | Sakata | G11C 7/1006 |
| | | | 365/202 |
| 2010/0290292 A1* | 11/2010 | Tanizaki | G11C 16/10 |
| | | | 365/185.22 |
| 2013/0088911 A1* | 4/2013 | Nakura | G11C 13/0002 |
| | | | 365/148 |
| 2014/0160857 A1* | 6/2014 | Oh | G11C 13/0069 |
| | | | 365/185.23 |
| 2015/0143020 A1* | 5/2015 | Ferreira | G11C 8/12 |
| | | | 711/102 |
| 2015/0221369 A1* | 8/2015 | Jeong | G11C 13/0069 |
| | | | 365/163 |
| 2017/0011792 A1* | 1/2017 | Oh | G11C 11/40622 |

\* cited by examiner

NONVOLATILE MEMORY DEVICE AND OPERATING METHOD OF THE SAME

This application claims priority under 35 U.S.C. § 119, to Korean Patent Application No. 10-2017-0003448, filed on Jan. 10, 2017 in the Korean Intellectual Property Office, the contents of which are herein incorporated by reference in their entirety.

TECHNICAL FIELD

The present disclosure relates to a memory device, and more particularly, to a nonvolatile memory device and a method of operating the same.

DISCUSSION OF THE RELATED ART

Nonvolatile memory devices are memory devices that are able to retain contents stored therein, even in the absence of power. Some non-volatile memory devices store memory according to the phase of a resistance material. An example of such a memory includes a phase change random access memory (PRAM) device, a resistive memory (resistive RAM: RRAM) device, a magnetic memory (magnetic RAM: MRAM) device and the like. A dynamic memory (dynamic RAM: DRAM) device and a flash memory device store data using charge, whereas a nonvolatile memory device using the resistance material stores the data, using a state change (e.g. as is the case for PRAM) of a phase change material such as a chalcogenide alloy, a resistance change (e.g. as is the case for RRAM) of a variable resistance material, a resistance change (e.g. as is the case for MRAM) of a magnetic tunnel junction (MTJ) thin film according to the magnetization state of a ferromagnetic material, and the like.

Among the nonvolatile memory devices using the resistance material, the phase change memory device includes a phase change material that is heated by the application of a write current. The material that is so heated by the write current selectively changes into a crystalline state or an amorphous state, as it is cooled. This process can be controlled such that data can be stored by a given area of the resistance material being either in the crystalline state or the amorphous state. The phase change material in the crystalline state has a relatively row resistance, and a phase change material in the amorphous state has a relatively high resistance. Thus, the memory device may be read by determining if a given section has the relatively high resistance or the relatively low resistance. Therefore, the crystal state may be defined as set data or 0 data, and the amorphous state may be defined as reset data or 1 data.

As described above, since the phase change memory device heats the substance utilizing the write current, performance may be limited due to the power consumption during writing operation.

SUMMARY

A nonvolatile memory device includes a plurality of memory banks and a plurality of write block circuits. Each of the plurality of memory banks includes a memory cell array having a plurality of memory cells. Each of the plurality of memory cells is disposed in regions of the plurality of memory banks in which a plurality of bit lines and a plurality of word lines intersect with each other. The plurality of write block circuits is connected to the plurality of memory banks. Each of the write block circuits of the plurality of write block circuits includes a plurality of write drivers, that are each connected to the plurality of bit lines, and each of the plurality of write block circuits provides a write current of the memory cells to the bit lines. A total number of write block circuits of the plurality of write block circuits, is used to determine the number of memory banks, of the plurality of memory banks, that are simultaneously provided with a write command from a host. A total number of write drivers of the number of the plurality of write drivers that are activated is based on a predetermined reference value.

A method of operating a nonvolatile memory includes providing write commands to a plurality of memory banks, it is determined whether the write command provided to the plurality of memory banks is simultaneously provided to each memory bank of the plurality of memory banks. A plurality of write block circuits, connected to the plurality of memory banks, is controlled based on the determined result. Each of the plurality of write block circuits includes a plurality of write drivers which provides a write current to the plurality of memory banks. Controlling the plurality of write block circuits includes determining a number of memory banks, of the plurality of memory banks, that are simultaneously provided with the write command, and determining a number of the plurality of write drivers that are activated based on a predetermined reference value.

A non-volatile memory device includes a plurality of memory banks, each including an array of phase change memory cells divided into a plurality of blocks. A plurality of write drivers write to the phase change memory cells of the plurality of memory banks. A maximum number of blocks of the plurality of blocks that are simultaneously written to by the plurality of write drivers is determined based on a number of phase change memory cells, of the plurality of memory banks, that is in an idle state.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DISCLOSURE

Figure 1:
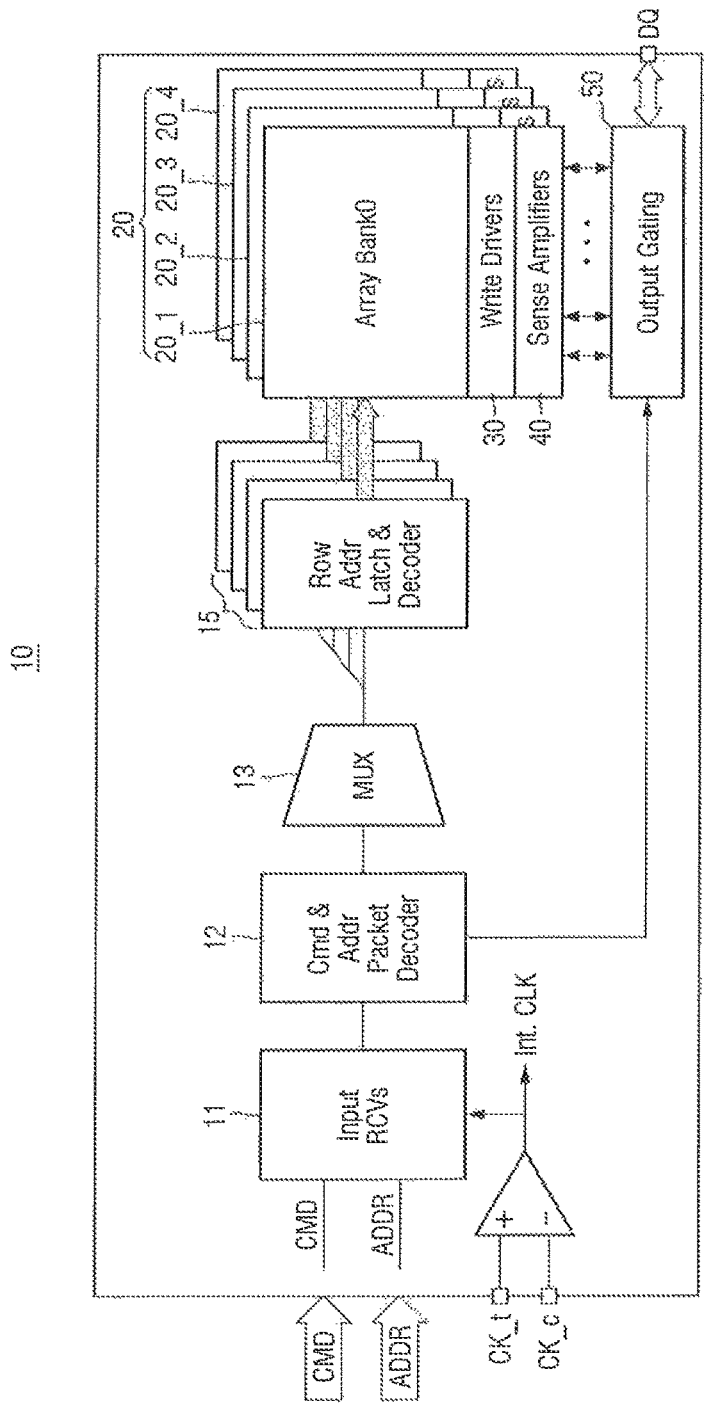
FIG. 1 is a block diagram illustrating a nonvolatile memory device according to some exemplary embodiments of the present disclosure.

In describing exemplary embodiments of the present disclosure illustrated in the drawings, specific terminology is employed for the sake of clarity. However, the present disclosure is not intended to be limited to the specific terminology so selected, and it is to be understood that each specific element includes all technical equivalents which operate in a similar manner.

Hereinafter, an image sensor according to an exemplary embodiment of the present disclosure will be described with reference to FIGS. 1 to 10.

FIG. 1 is a block diagram illustrating a nonvolatile memory according to some exemplary embodiments of the present disclosure.

Referring to FIG. 1, a nonvolatile memory device 10 according to some exemplary embodiments of the present disclosure includes an input receiver 11, a packet decoder 12, a multiplexer 13, an address latch and decoder 15, a memory bank 20, a write block circuit 30, a sense amplifier 40, an output gating 50, and the like.

The input receiver 11 may receive a command (CMD) and an address (ADDR) for accessing the nonvolatile memory device 10 from an outside source, and may provide the command (CMD) and the address (ADDR) to the packet decoder 12. The command (CMD) and the address (ADDR) may be, for example, provided from a host. The input receiver 11 may receive a clock signal (CK_t) and a complementary clock signal (CK_c) from an outside source.

The packet decoder 12 may decode the command (CMD) and the address (ADDR) provided from the input receiver 11, and may provide the command (CMD) and the address (ADDR) to both the multiplexer 13 and the output gating 50. For example, the packet decoder 12 may decode the address (ADDR), generate a bank address and a row address, and provide the bank address and row address to the multiplexer 13. In addition, the packet decoder 12 may decode the address (ADDR) to generate a column address and may provide the column address to the output gating 50.

The multiplexer 13 may receive the bank address and the row address from the packet decoder 12, and may provide the bank address and the row address to the address latch and the decoder 15. The multiplexer 13 may include a buffer which can temporarily store the bank address and the row address therein.

The address latch and decoder 15 may provide the bank address and the row address, which were provided from the multiplexer 13, to the memory bank 20. In some exemplary embodiments of the present disclosure, the address latch and the decoder 15 may include a plurality of latches and decoders. For example, the plurality of latches and decoders may be connected to correspond to the number of the plurality of memory banks (20_1 to 20_4).

In FIG. 1, the nonvolatile memory device 10, according to an exemplary embodiment of the present disclosure, is illustrated as including four latches and four decoders (15), but the present disclosure is not limited to thereto. The nonvolatile memory device 10 may include a plurality of latches and decoders 15 corresponding to the number of memory banks 20.

The address latch and decoder 15 may select a memory bank to be accessed among the plurality of memory banks (20_1 to 20_4), using the bank address. Further, with respect to the selected memory bank, it is possible to activate a word line corresponding to the row address, using the provided row address. For example, the address latch and decoder 15 may apply the word line drive voltage to the word line corresponding to the row address.

In some exemplary embodiments of the present disclosure, the nonvolatile memory device 10 may include a plurality of memory banks (20_1 to 20_4) in the form of a memory cell array. As may be seen in FIG. 1, the nonvolatile memory device 10, according to an exemplary embodiment of the present disclosure, is illustrated as including the four memory banks (20_1 to 20_4), but the present disclosure is not limited thereto. For example, the number of the plurality of memory banks 20 may be variously changed in accordance with the design of the nonvolatile memory device 10 and the configuration of the peripheral circuit corresponding to the memory bank 20.

In some exemplary embodiments of the present disclosure, the memory bank 20 may include a memory cell array that includes a resistive memory cell (RMC). The structure of the memory cell included in the nonvolatile memory device, according to some exemplary embodiments of the present disclosure, will be described with reference to FIG. 2.

Figure 2:
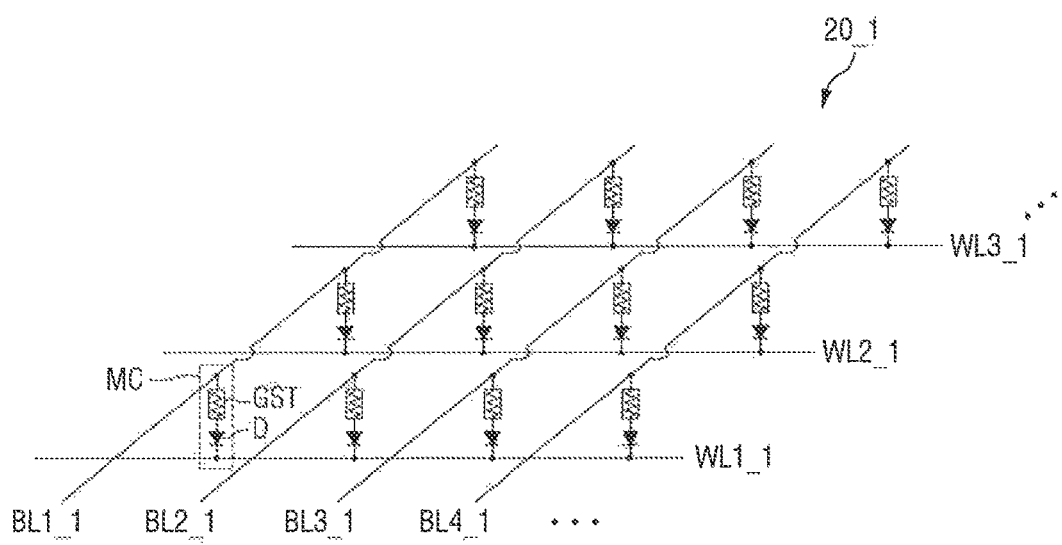
FIGS. 2 and 3 are diagrams illustrating a memory cell array included in a memory bank of FIG. 1, in accordance with exemplary embodiments of the present disclosure.
Figure 3:
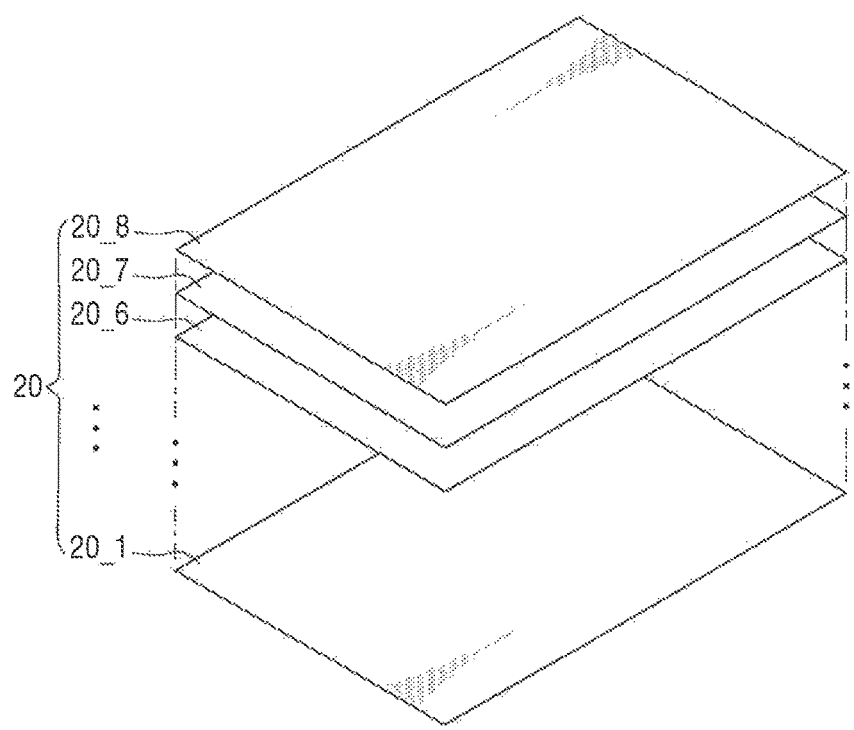

FIGS. 2 and 3 are diagrams illustrating a memory cell array included in the memory bank of FIG. 1 according to exemplary embodiments of the present disclosure.

Referring to FIG. 2, the memory bank 201 may have a cross point structure. The cross point structure is a structure in which a single resistive memory cell (MC) is formed in a region in which one line intersects with the other line. For example, the bit lines (BL1_4 to BL4_1) are formed to extend in the first direction, the word lines (WL1_1 to WL3_1) are formed by extending in the second direction. The word lines (WL1_1 to WL3_1) intersect with the bit lines (BL1_1 to BL4_1), and the resistive memory cell (MC) may be formed in a region in which each of the bit lines (BL1_1 to BL4_1) intersects with each of the word lines (WL1_1 to WL3_1).

When the resistive memory cell (MC) is a PRAM, the resistive memory cell (MC) may include a variable resistance element (GST) including a phase change material, and an access element D which controls a current flowing through the variable resistance element (GST).

In FIG. 2, the access element D may be a diode or a transistor (not illustrated) connected in series with the variable resistance element (GST).

Examples of phase change materials that may be used in the resistive memory cell (RMC) may include GaSb, InSb, InSe, Sb2Te3 and GeTe obtained by combining two elements, GeSbTe, GaSeTe, InSbTe, SnSb2Te4 and InSbGe obtained by combining three elements, AgInSbTe, (GeSn)SbTe, GeSb(SeTe), and/or Te81Ge15Sb2S2 obtained by combining four elements, and the like. In some exemplary embodiments of the present disclosure, GeSbTe consisting of germanium (Ge), antimony (Sb) and terbium (Te) may be used as a phase change material.

On the other hand, when the resistive memory cell (RMC) is an RRAM, the variable resistance element (GST) may include a complex metal oxide. When the resistive memory cell (RMC) is an RRAM, the resistive memory cell (RMC) may include, for example, NiO or perovskite. Perovskite may be composition such as manganite (Pr0.7Ca0.3MnO3, Pr0.5Ca0.5MnO 3, other PCMO, LCMO etc.), titanate (STO:Cr), zirconate (SZO:Cr, Ca2Nb2O7:Cr, Ta2O5:Cr etc.). A filament may be formed in the variable resistance element (GST), and the filament may be a current path for the cell current flowing through the resistive memory cell (RMC). In some exemplary embodiments of the present invention, when the resistive memory cell (RMC) is an RRAM, an access element D that controls the current flowing through the variable resistance element (GST) may be omitted.

When the resistive memory cell (RMC) is an MRAM, the variable resistance element (GST) may include an upper electrode of a magnetic material, a lower electrode of a magnetic material, and a dielectric disposed therebetween.

Hereinafter, the case where the resistive memory cell (RMC) is a PRAM will be described, but the technical idea of the present disclosure is not limited thereto.

Figure 5:
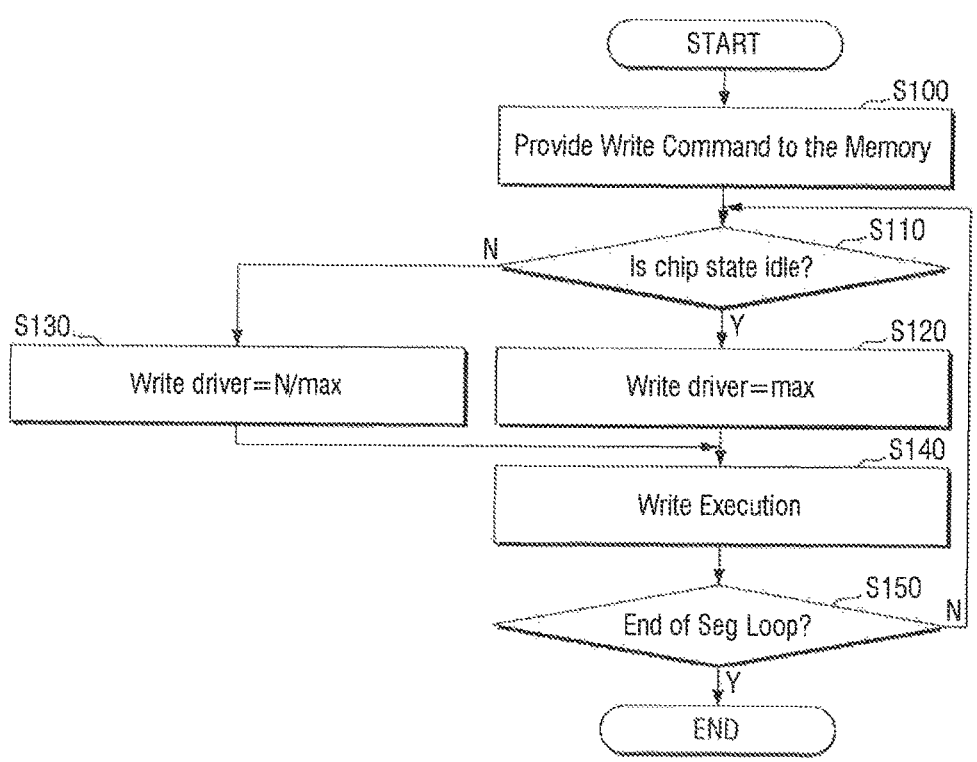
FIG. 5 is a flowchart illustrating an operation of a nonvolatile memory device according to some exemplary embodiments of the present disclosure.

As illustrated in FIG. 5, the memory cell array may have a three-dimensional stacked structure. The three-dimensional stacked structure is a form in which a large number of memory cell layers (21_1 to 21_8) are vertically stacked. Although an example in which the eight memory cell layers (20_1 to 20_8) are stacked is illustrated in the drawings, the disclosure is not limited thereto. Here, each of the memory cell layers (21_1 to 21_8) may be included in each of the plurality of memory banks 20.

Each of the memory cell layers (21_1 to 21_8) may include a plurality of memory cell groups and/or a plurality of redundant memory cell groups. When the memory cell array has a three-dimensional stacked structure, each of the memory cell layers (21_1 to 21_8) may have a cross point structure illustrated in FIG. 4.

Referring to FIG. 1 again, each memory bank 20 may be connected to the write block circuits 30 and the sense amplifiers 40.

The output gating 50 may receive the decoded bank address and column address from the packet decoder 12, and may activate the write block circuit 30 or the sense amplifier 40 corresponding thereto.

For example, when the command (CMD) received by the input receiving unit 11 is a write command, the output gating 50 may activate the write block circuit 30 corresponding to the bank address and the column address to be written. The activated write block circuit 30 may apply the write current to the bit line of the memory bank 20, and may record the data in the memory cell located in the address subjected to the write command.

When the command (CMD) received by the input receiving unit 11 is a read command, the output gating 50 may activate the sense amplifier 40 corresponding to the bank address and the column address to be read. The activated sense amplifier 30 may read the data provided from the memory bank 20.

The nonvolatile memory device 10, according to an exemplary embodiment of the present disclosure, may dynamically adjust the number of write drivers included in the write block circuit 30 used for the writing operation to the memory bank 20. For example, in accordance with the number of memory banks 10 used in the writing operation, the number of write drivers activated and used for the writing operation may change. This will be described in detail later.

Figure 4:
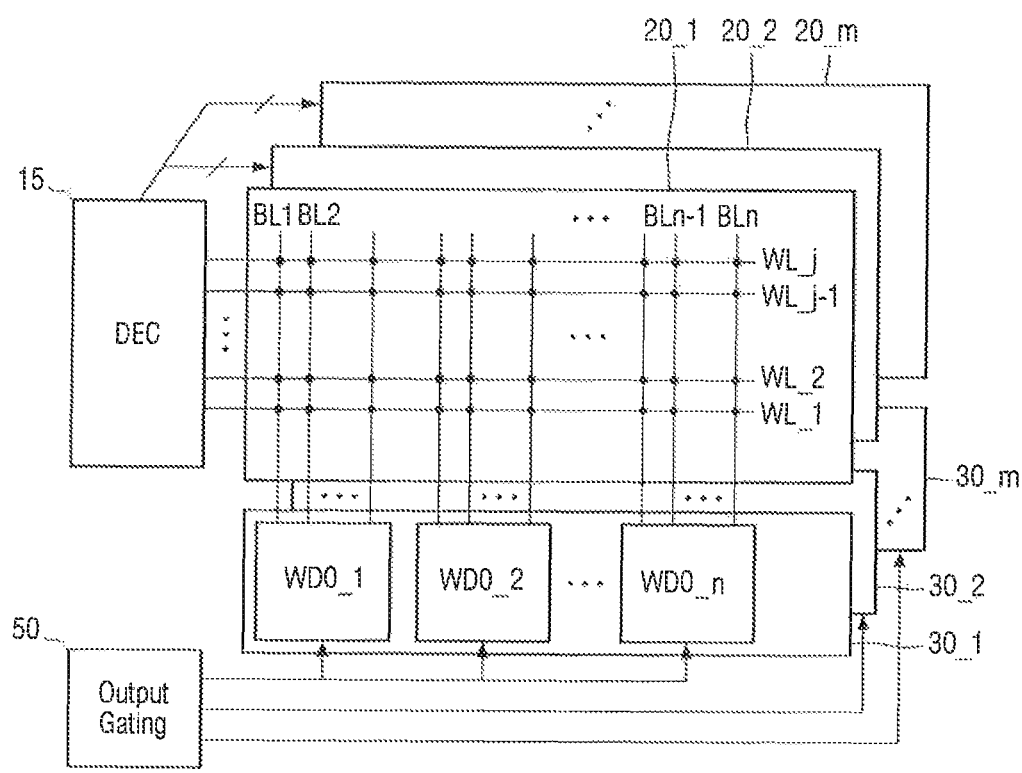
FIG. 4 is a block diagram illustrating a nonvolatile memory device according to some exemplary embodiments of the present disclosure.

FIG. 4 is a block diagram illustrating a nonvolatile memory device according to some exemplary embodiments of the present disclosure.

Referring to FIG. 4, a memory hank 20 (20_1, 20_2, . . . , 20_m) included in the nonvolatile memory device 10 of the present disclosure and peripheral circuits thereof are illustrated. The peripheral circuit may include an address latch and decoder 15, a write block circuit 30 (30_1, 30_2, . . . , 30_m), an output gating 50 and the like. Since the following description will be given by a writing operation executed by the nonvolatile memory device 10 of the present disclosure, it is to be understood that additional constituent elements may be present.

In FIG. 4, a plurality of bit lines (BL1, BL2, . . . , BLn-1, BLn), extending in a first direction, and a plurality of word lines (WL_1, WL_, WL_j-1, WL_j), extending in a second direction intersecting with the second first direction, are disposed. As described above, one resistive memory cell (RMC) may be formed in a region in which a plurality of bit lines (BL1 to BLn) and a plurality of word lines (WL_1 to WL_j) intersect with each other.

The nonvolatile memory device 10, according to some exemplary embodiments of the present disclosure, may include a plurality of memory banks (20_1 to 20_m). As illustrated in FIG. 4, the nonvolatile memory device 10 will be described as including m memory banks (20_1 to 20_m).

The nonvolatile memory device 10 may have the write block circuits (30_1 to 30_m) of the number corresponding to the plurality of memory banks (20_1 to 20_m). Hereinafter, the nonvolatile memory device 10 will be described as including in write block circuits (30_1 to 30_m) of the number corresponding to the m memory banks (20_1 to 20_m).

For example, the first memory bank 20_1 may be connected to the first write block circuit 30_1, and the second memory bank 20_2 may be connected to the second write block circuit 30_2. Similarly, the m-th memory bank 20_m may be connected to the m-th write block circuit 30_m.

Further, the respective write block circuits (30_1 to 30_m) may include write drivers (WD0_1, WD0_2, . . . , WD0_n) therein. In FIG. 4, as an example, each of the write block circuit (30_1 to 30_m) is illustrated to include n write drivers (WD0_1 to WD0_n).

The respective bit lines (BL1 to BLn) may be connected to the write block circuit 30. For example, the respective bit lines (BL1 to BLn) may be connected to the write drivers (WD0_1 to WD0_n) included in the write block circuit 30. Each of the write drivers (WD0_1 to WD0_n) may be connected to at least one bit lines (BL1 to BLn) to provide the write current to the bit lines (BL1 to BLn).

The output gating 50 may be connected to the respective write block circuits (30_1 to 30_m), and the output gating 50 may be connected to the write drivers (WD0_1 to WD0_n) in the write block circuits (30_1 to 30_m) to control the write drivers (WD0_1 to WD0_n).

FIG. 5 is a flowchart illustrating the operation of the nonvolatile memory device 10 according to some exemplary embodiments of the present disclosure.

Referring to FIG. 5, the nonvolatile memory device 10, according to an exemplary embodiment of the present disclosure, provides a write command to the memory (Step S100), and checks whether the state of the chip is in an idle state (Step S110). In the case of the idle state, (Y) the nonvolatile memory device 10 sets the write driver assigned to the writing operation as a preset maximum write driver (Step S120). In the case of the non-idle state (N), the nonvolatile memory device 10 sets the write driver assigned to the writing operation to max/N (Step S130) and executes a write command (Step S140). After checking whether or not the write command is ended (Step S150), the process is ended if the write command is ended (Y). If the write command is not ended (N), the state of chip is checked again (Step S110).

Hereinafter, the operation of the nonvolatile memory according to an exemplary embodiment of the present disclosure will be described with reference to the timing chart of FIG. 6.

Figure 6:
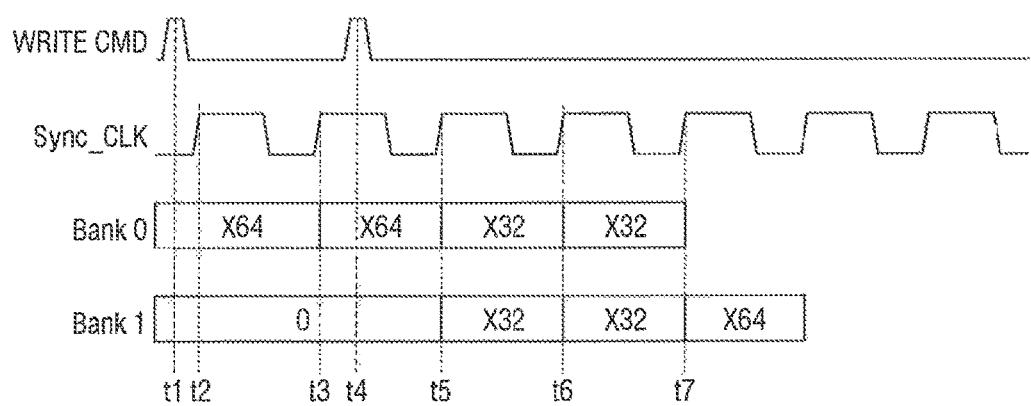
FIG. 6 is a timing chart illustrating an operation of a nonvolatile memory device according to some exemplary embodiments of the present disclosure.

FIG. 6 is a timing chart illustrating the operation of a nonvolatile memory device according to some exemplary embodiments of the present disclosure.

Referring to FIGS. 5 and 6, a write command is provided at time t1 (S100). The write command (CMD) may be provided from the host. In addition to the write command (CMD) from the host, the memory bank 20 to be written, and the address (ADDR) including the address of the row included in the memory bank 20 may be provided together.

The packet decoder 12 included in the memory device receives the write command (CMD) and the address (ADDR), and may decode and provide the write command (CMD) and the address (ADDR) to the address latch and decoder 15. The address latch and decoder 15 may select memory banks to be accessed among the plurality of memory banks (20_1 to 20_m) on the basis of the provided bank address. Further, the address latch and decoder 15 may select word lines (WL_1 to WL_j) to be accessed from the memory bank based on the provided row address.

The write command may be provided at time t1, and the write command is checked to determine whether or not the memory subjected to the write command is in the idle state (S110).

Whether or not the memory is in the idle state may be determined by checking whether there are memory banks (20_1 to 20_m) in which the write command is performed. For example, if the writing operation is not performed on the memory banks (20_1 to 20_m), the memory is considered to be in the idle state (Y), and the number of the write drivers to be driven is set to a predetermined maximum value.

When the writing operation is performed on the memory banks (20_1 to 20_m), the memory is considered to be not in the idle state (N), and the number of memory banks N in which the writing operation is performed, and the number of write drivers to be driven based on a predetermined maximum value are set.

For example, the time t1 corresponds to a case where the writing operation of the first memory bank (Bank 0) and the second memory bank (Bank 1) is not performed, and when the clock (Sync_CLK) is toggled at the rising edge at time t2, the writing operation of the first memory bank (Bank 0) is started.

At this time, the number of write drivers used for the writing operation of the first memory hank (Bank 0) may be determined by a predetermined maximum value (max). FIG. 6 illustrates that the maximum value of the write driver is set to 64, as an example.

Figure 7:
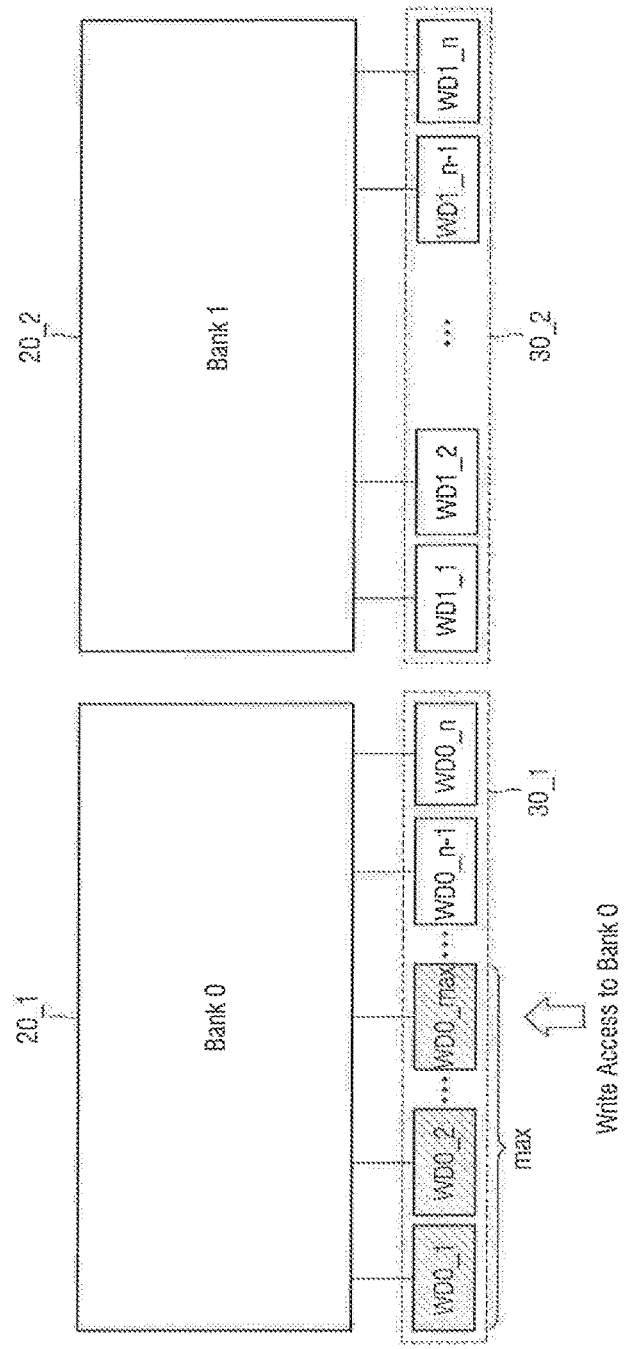
FIG. 7 is a conceptual diagram illustrating an operation of a nonvolatile memory device according to some exemplary embodiments of the present disclosure.

FIG. 7 is a conceptual diagram illustrating the operation of a nonvolatile memory device according to some exemplary embodiments of the present disclosure.

FIG. 7 conceptually illustrates a configuration in which a write access is performed only on the first memory bank (Bank 0), and among the n write drivers (WD0_1 to WD0_n), only a write driver of a predetermined maximum value (max) is operated.

In FIG. 6, although the predetermined maximum value (max) is described as 64, it is to be understood that the present disclosure is not limited thereto. The predetermined maximum value (max) may vary depending on an amount of power required or the like, at the writing operation of the nonvolatile memory device 10.

Referring to FIG. 6, the rising edge of another clock (Sync_CLK) is toggled at time t3, and the writing process of the first memory bank (Bank 0) started at time t2 may be restarted.

At time t4, a write command to the second memory bank (Bank 1) is provided. When there is a writing command to the second memory bank (Bank 1), it is checked whether or not the memory is in the idle state (S110). In this example, since the writing operation is performed by a write command to the first memory hank (Bank 1), the memory is not in the idle state. Therefore, the maximum value of the write driver to be used when performing the writing operation of the second memory bank (Bank 1) is determined, on the basis of the predetermined maximum value (max) of the write driver and the number N of the memory banks in which the writing operation is currently performed (S130).

In some exemplary embodiments of the present disclosure, the maximum value of the write driver to be used when performing the writing operation of the second memory bank (Bank 1) may be a value obtained by dividing the predetermined maximum value (max) of the write driver by N.

Figure 8:
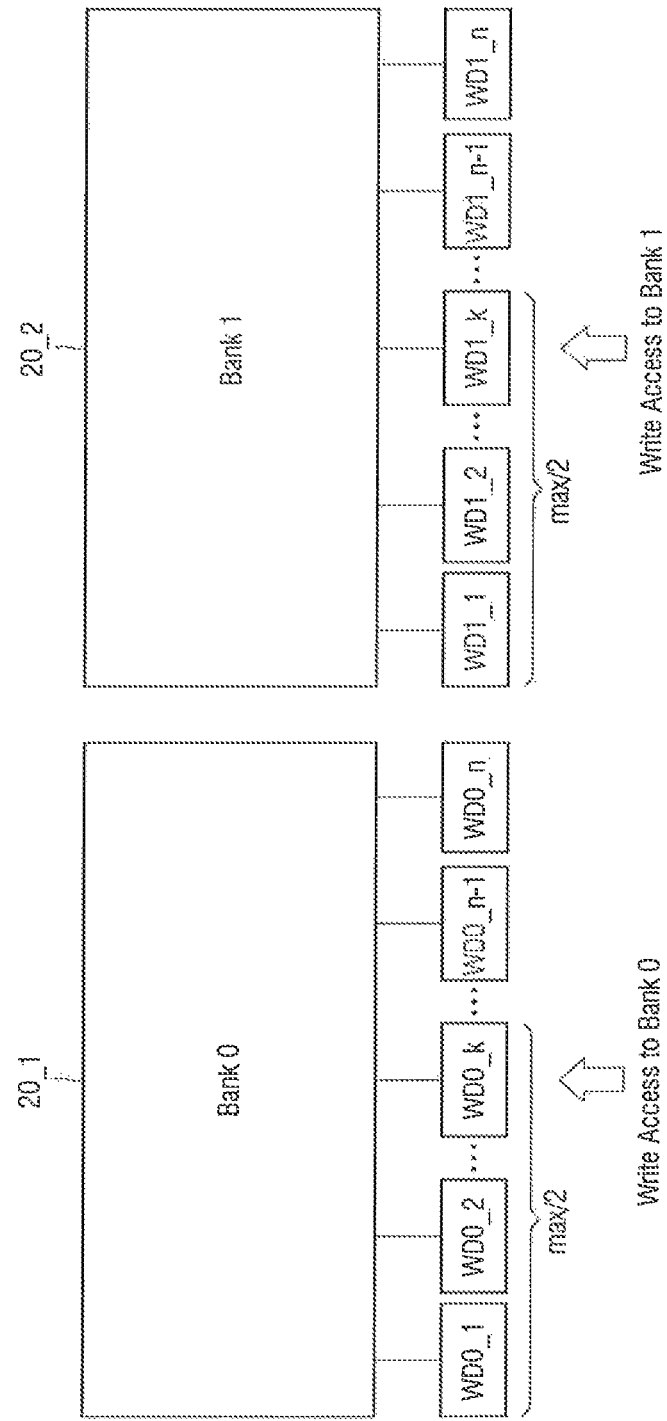
FIG. 8 is a conceptual diagram illustrating an operation of a nonvolatile memory device according to some exemplary embodiments of the present disclosure.

FIG. 8 is a conceptual diagram illustrating the operation of a nonvolatile memory device according to some exemplary embodiments of the present disclosure.

Referring to FIG. 8, the write commands are simultaneously transmitted to the first memory bank (Bank 0) and the second memory bank (Bank 1), and only the k-th write driver (WD0_k, WD1_k) are activated in accordance with the aforementioned mechanism and may be used for the writing operation. Here, k=max/2.

In FIG. 6, considering that the memory bank in which the current writing operation is performed is a single first memory bank (Bank 0), the write driver to be used at the time of the writing operation of the second memory bank (Bank 1) may be 64/2=32.

The writing operation of the second memory bank (Bank 1) of the write command to the second memory bank (Bank 1) may be performed at time t5. For example, at the time t5 when the write command to the second memory bank (Bank 1) is received and the dock (Sync_CLK) is toggled at another rising edge, the write command to the second memory hank (Bank 1) may be performed.

In a nonvolatile memory according to an exemplary embodiment of the present disclosure, at the time t5, the first memory bank (Bank 0) may also be reduced to 32. At time t5, the writing operation is simultaneously performed on the first memory bank (Bank 0) and the second memory bank (Bank 1), and the number of write drivers used by them may be the same.

Figure 9:
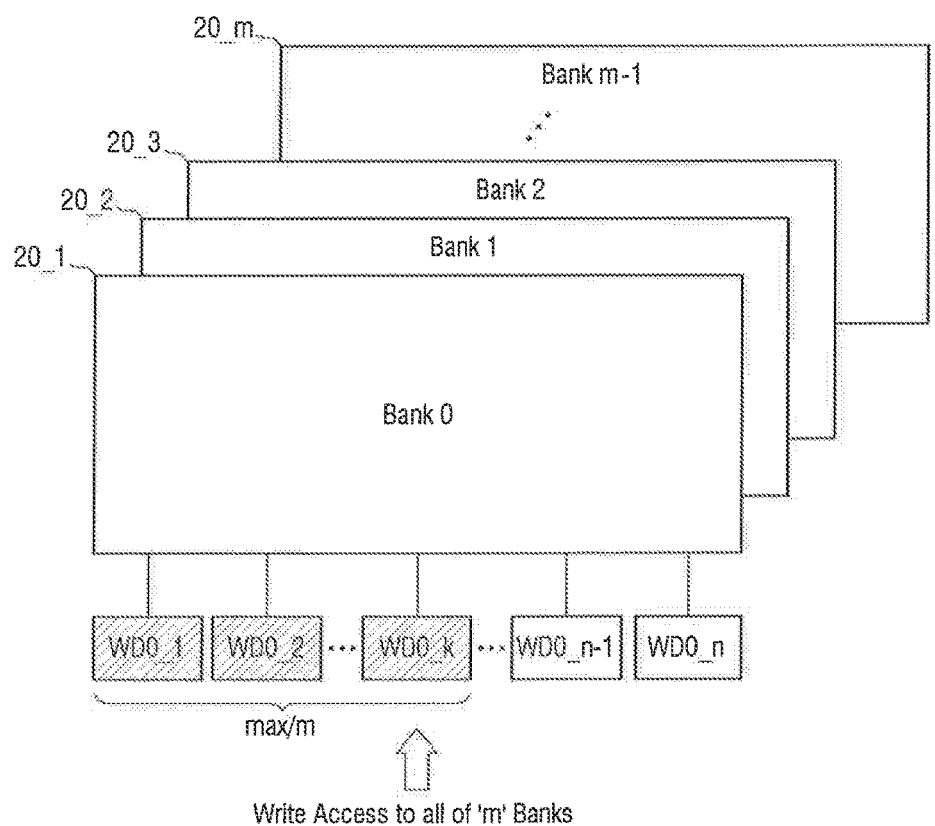
FIG. 9 is a conceptual diagram illustrating an operation of a nonvolatile memory device according to some exemplary embodiments of the present disclosure.

FIG. 9 is a conceptual diagram illustrating the operation of a nonvolatile memory device according to some exemplary embodiments of the present disclosure.

Referring to FIG. 9, the writing operations are simultaneously performed on the first to m-th memory banks (Bank 0 to Bank m-1) referring to FIG. 8. Based on the aforementioned mechanism, only the k-th write drivers (WD0_k, WD1_k) are activated and may be used in the wiring operation. Here, k=max/m.

In the nonvolatile memory device 10, according to some exemplary embodiments of the present disclosure, the writing operation applies a write current so that the resistive memory cell (RMC) can be changed to a crystalline state or an amorphous state. Since this involves an operation of heating the resistive memory cell (RMC), the magnitude of the write current level is relatively large, and the amount of power required for the writing operation may also be large.

In some exemplary embodiments of the present disclosure, when the writing operation is performed, all the write drivers (WD0_1 to WD0_n) included in the write block circuits (30_1 to 30_m) allocated to the respective memory bank (20_1 to 20_m) might not be used, For example, as described above, the amount of power required at the time of the writing operation of the nonvolatile memory device 10 is large, among the write drivers (WD0_1 to WD) included in the write block circuits (30_1 to 30_m), only the number of predetermined maximum values (max) might be activated and operated.

However, when the writing operation of two or more memory banks (20_1 to 20_m) are performed at the same time, the number of write block circuits activated at the same time should not exceed the maximum value (max).

For example, to satisfy the above-described amount of power required, max/2 write drivers may be activated in the first write block circuit 30_1, and max/2 write drivers may be activated in the second write block circuit 30_2 so as to perform the writing operation of the first and second memory banks (20_1 to 20_2) when the writing operation is simultaneously performed on the first and second memory banks (20_1 to 20_2).

In general, when the writing operation is simultaneously performed on the m memory banks (20_1 to 20_m), in order to perform the writing operation of the first to m-th memory banks (20_1 to 20_m), the maxim write drivers may be activated in the first write block the circuit 30_1, and the maxim write drivers may be activated in m-th write block circuit 30_m.

In this way, in the nonvolatile memory device 10, according to some exemplary embodiments of the present disclosure, even though the writing operations of the memory banks are simultaneously performed, among the write drivers included in the write block circuit, the total sum of the write drivers to be activated may be limited to a predetermined maximum value (max). Therefore, the power consumed when performing the writing operation of the nonvolatile memory device 10 might not exceed a certain reference value.

In addition, when the writing operation is simultaneously performed on the m memory banks, the total number of activated write drivers among each write block circuit may be constant to the number of predetermined maximum values (max). Thus, the bandwidth and the throughput of the writing operation of the nonvolatile memory device 10 may be maintained at a constant level.

In some exemplary embodiments of the present disclosure, the output gating 50 may determine the number of output drivers that are activated based on the number of memory banks in which the current writing operation is being performed.

Figure 10:
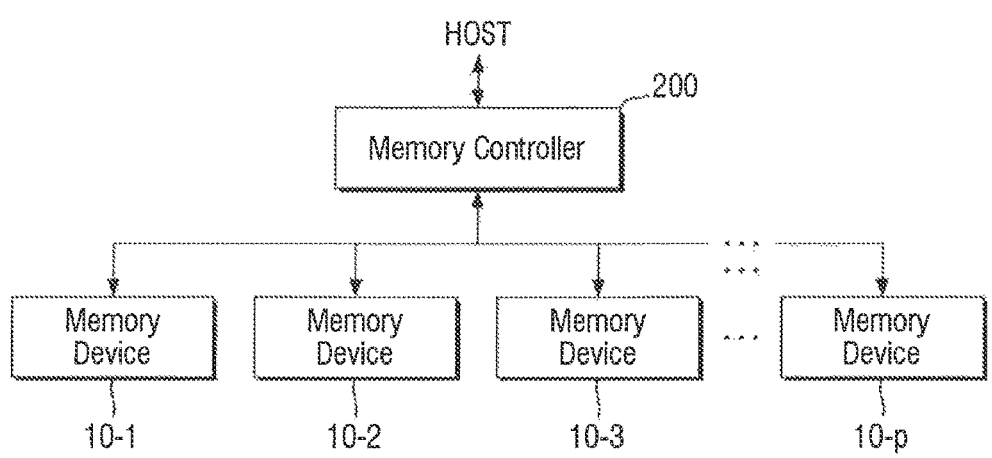
FIG. 10 is a block diagram illustrating a memory device according to some exemplary embodiments of the present disclosure.

FIG. 10 is a block diagram illustrating a memory device according to some exemplary embodiments of the present invention.

Referring to FIG. 10, the memory device may include a memory controller 200 and a plurality of memory elements (10-1, 10-2, 10-3, ..., 10-p).

In response to a read request and a write request from the host (HOST), the memory controller 200 may control a plurality of memory elements (10-1 to 10-p) to read data stored in the plurality of memory elements (10-1 to 10-p) or to write data to a plurality of memory elements (10-1 to 10-p).

For example, the memory controller 200 may control a program or write, read and erase operations on the plurality of memory elements (10-1 to 10-p), by providing an address, a command and a control signal to the plurality of memory elements (10-1 to 10-p).

In some exemplary embodiments of the present disclosure, the host (HOST) may include, for example, a central processing unit (CPU), a graphic processing unit (GPU), or an application processor (AP) or the like, but the present disclosure is not limited thereto.

The memory controller 200 may provide program data to be written on a plurality of memory elements (10-1 to 10-p) through the input/output data lines, and the data read from the plurality of memory elements (10-1 to 10-p) may be provided to the memory controller 200 through the input/output data lines. The memory controller 200 may provide addresses, commands and control signals to the plurality of memory elements (10-1 to 10-p) through the control line.

The memory controller 200 and the plurality of memory elements (10-1 to 10-p) may be integrated into a single semiconductor device. For example, the memory controller 200 and the plurality of memory elements (10-1 to 10-p) may be integrated in a single memory card. For example, the memory controller 200 and the plurality of memory elements (10-1 to 10-p) may be integrated into a single semiconductor device to constitute a PC card (PCMCIA), a compact flash card (CF), a smart media card (SM/SMC), a memory stick, a multimedia card (MMC, RS-MMC and MMCmicro), an SD card (SD, miniSD and microSD), a universal flash storage device (UFS) and the like. In addition, for example, the memory controller 200 and the plurality of memory elements (10-1 to 10-p) may be integrated into a single semiconductor device to constitute a solid state disk/drive (SSD).

In the nonvolatile memory device, according to some exemplary embodiments of the present disclosure, the memory controller 200 may control the operation of the write driver as described above. For example, the memory controller 200 controls the memory banks included in the p memory devices (10-1 to 10-p) and the write block circuits connected to correspond to the memory banks, and may determine whether or not to activate the write drivers included in the write block circuit, based on a predetermined maximum value (max) at the time of writing of the memory device (10-1 to 10-p) and the number of memory banks in which the current writing operation is being performed.

While the present disclosure has been particularly illustrated and described with reference to exemplary embodiments thereof, it will be understood by those of ordinary skill in the art that various changes in form and detail may be made therein without departing from the spirit and scope of the present disclosure.

What is claimed is:

1. A nonvolatile memory device comprising:
a plurality of memory banks each of which comprising a memory cell array including a plurality of memory cells, each of the plurality of memory cells being disposed in regions of the plurality of memory banks in which a plurality of bit lines and a plurality of word lines intersect with each other; and
a plurality of write block circuits connected to the plurality of memory banks, wherein each of the write block circuits of the plurality of write block circuits comprises a plurality of write drivers, connected to the plurality of bit lines, and providing a write current of the memory cells to the bit lines,
wherein a total number of write block circuits of the plurality of write block circuits, is used to determine a number of memory banks, of the plurality of memory banks, that are simultaneously provided with a write command from a host, and wherein a total number of write drivers of the plurality of write drivers that are activated is based on a predetermined reference value.

2. The nonvolatile memory device of claim 1, wherein the plurality of write block circuits activates write drivers of the plurality of write drivers having the predetermined reference value, when each of the plurality of memory devices is in an idle state, and when the write command is provided to the plurality of memory banks.

3. The nonvolatile memory device of claim 2, wherein the predetermined reference value is determined, based on an amount of a maximum power required at the time of the writing operation of the nonvolatile memory device.

4. The nonvolatile memory device of claim 1, wherein the plurality of memory banks comprises first to m-th memory banks (where m is an integer greater or equal to 2), and the plurality of write block circuits comprises first to m-th write block circuits each connected to correspond to the plurality of memory banks.

5. The nonvolatile memory device of claim 4, wherein the first to m-th write block circuits comprise first to n-th write drivers (where n is an integer greater than or equal to 2), and when the write command from the host is directed to the k memory banks, each of the write block circuits activates max/k (where max is the predetermined reference value) write drivers among the n write drivers.

6. The nonvolatile memory device of claim 4, wherein the number of write drivers simultaneously activated in the plurality of write blocks does not exceed the predetermined reference value.

7. The nonvolatile memory device of claim 1, wherein the plurality of write block. circuits reduces the number of the activated write blocks, when the number of memory banks simultaneously provided with the write command from the host increases.

8. The nonvolatile memory device of claim 1, wherein the memory cell comprises a resistive memory cell.

9. The nonvolatile memory device of claim 8, wherein the plurality of memory banks comprises a variable resistance element connected to the memory cell, and an access element for controlling a current flowing through the variable resistance element.

10. The nonvolatile memory device of claim 1, wherein a clock signal is provided from the host to the memory bank, and the memory bank executes the write command in synchronization with the clock signal.

11. A method of operating a. nonvolatile memory, the method comprising:

providing write commands to a plurality of memory banks;

determining whether the write command provided to the plurality of memory banks is simultaneously provided to each memory bank of the plurality of memory banks; and controlling a plurality of write block circuits, connected to the plurality of memory banks, based on the determined result, wherein each of the plurality of write block circuits comprise a plurality of write drivers which provides a write current to the plurality of memory banks, and controlling the plurality of write block circuits comprises:
determining a number of memory banks, of the plurality of memory banks, that are simultaneously provided with the write command, and determining a number of the plurality of write drivers that are activated based on a predetermined reference value.

12. The method of claim 11, wherein determining the number of the plurality of write drivers that are activated comprises:

reducing the number of the activated write blocks, when the number of memory banks simultaneously provided with the write command from the host increases.

13. The method of claim 11, wherein determining the number of the plurality of write drivers that are activated comprises:

determining whether all the plurality of memory devices are in an idle state, when the write command is provided to the memory bank, and activating the write drivers having the predetermined reference value.

14. The method of claim 11, wherein the number of the plurality of write block circuits is equal to the number of the plurality of memory banks.

15. A. non-volatile memory device, comprising:

a plurality of memory banks, each including an array of phase change memory cells divided into a plurality of blocks; and a plurality of write drivers for writing to the phase change memory cells of the plurality of memory banks, wherein a maximum number of blocks of the plurality of blocks that are simultaneously written to by the plurality of write drivers is determined based on a number of phase change memory cells, of the plurality of memory banks, that is in an idle state.

16. The non-volatile memory device of claim 15, wherein as the number of phase change memory cells, of the plurality of memory banks, that is in the idle state increases, the number of blocks that are simultaneously written to by the plurality of write drivers increases.

17. The non-volatile memory device of claim 15, wherein a maximum number of write drivers, of the plurality write drivers, that simultaneously write to phase change memory cells, of the plurality of memory banks, is constant irrespective of a number of blocks that are simultaneously written to by the plurality of write drivers.

18. The non-volatile memory device of claim 15, wherein the array of phase change memory cells is defined by a matrix of bit lines intersecting word lines.

19. The non-volatile memory device of claim 18, wherein each of the plurality of write drivers is connected to an intersection of a bit line and a word line.

20. The non-volatile memory device of claim 15, wherein each phase change memory cell includes a variable resistance element, a phase change material, and an access element for controlling a current through the variable resistance element.

* * * * *